(12) United States Patent
Periaman et al.

(10) Patent No.: US 8,110,930 B2
(45) Date of Patent: Feb. 7, 2012

(54) DIE BACKSIDE METALLIZATION AND SURFACE ACTIVATED BONDING FOR STACKED DIE PACKAGES

(75) Inventors: Shanggar Periaman, Penang (MY); Kooi Chi Ooi, Penang (MY); Yen Hsiang Chew, Penang (MY); Bok Eng Cheah, Penang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/820,454

(22) Filed: Jun. 19, 2007

(65) Prior Publication Data

US 2008/0315421 A1 Dec. 25, 2008

(51) Int. Cl.
*H01L 23/48* (2006.01)

(52) U.S. Cl. ........... 257/778; 257/E21.705; 257/E23.01; 257/E23.141; 257/E23.14; 257/E23.169; 257/E25.013; 257/E25.03; 257/E23.061; 257/E23.124; 257/E23.126; 257/758; 257/690; 257/777; 257/774; 257/773; 257/706; 257/714; 257/737; 257/723; 257/779; 257/772; 257/781

(58) Field of Classification Search .................. 257/778, 257/E21.705, E23.01, 758, 690, 777, E23.141, 257/723, 686, 685, 774, 773, E23.169, E23.069, 257/E25.013, E25.03, E23.061, E23.124, 257/E23.126, 706, 714, 737, 779, 772, 781

See application file for complete search history.

(56) References Cited

U.S. PATENT DOCUMENTS

| | | | | |
|---|---|---|---|---|
| 5,973,396 A | * | 10/1999 | Farnworth | 257/698 |
| 6,013,948 A | * | 1/2000 | Akram et al. | 257/698 |
| 6,383,837 B1 | * | 5/2002 | Tsunashima | 438/106 |
| 7,000,684 B2 | | 2/2006 | Kenny et al. | |
| 7,092,254 B1 | | 8/2006 | Monsef et al. | |
| 7,129,567 B2 | * | 10/2006 | Kirby et al. | 257/621 |
| 7,230,334 B2 | | 6/2007 | Andry et al. | |
| 7,279,795 B2 | * | 10/2007 | Periaman et al. | 257/777 |
| 7,317,256 B2 | * | 1/2008 | Williams et al. | 257/777 |
| 7,355,273 B2 | | 4/2008 | Jackson et al. | |
| 7,400,033 B1 | | 7/2008 | Cheah et al. | |
| 7,692,278 B2 | * | 4/2010 | Periaman et al. | 257/686 |
| 2002/0074637 A1 | * | 6/2002 | McFarland | 257/686 |
| 2005/0156320 A1 | * | 7/2005 | Mastromatteo | 257/777 |
| 2007/0158807 A1 | * | 7/2007 | Lu et al. | 257/686 |
| 2007/0210446 A1 | | 9/2007 | Andry et al. | |
| 2007/0235882 A1 | * | 10/2007 | Sekiguchi et al. | 257/777 |
| 2008/0079131 A1 | * | 4/2008 | Kim et al. | 257/686 |
| 2008/0083977 A1 | * | 4/2008 | Haba et al. | 257/686 |
| 2008/0150155 A1 | * | 6/2008 | Periaman et al. | 257/777 |
| 2008/0157322 A1 | * | 7/2008 | Tang et al. | 257/686 |
| 2008/0157350 A1 | | 7/2008 | Cheah | |
| 2008/0237310 A1 | * | 10/2008 | Periaman et al. | 228/180.5 |
| 2008/0315388 A1 | * | 12/2008 | Periaman et al. | 257/690 |
| 2009/0065951 A1 | * | 3/2009 | Cheah et al. | 257/778 |
| 2009/0125114 A1 | * | 5/2009 | May et al. | 623/20.14 |
| 2009/0127667 A1 | * | 5/2009 | Iwata | 257/621 |
| 2010/0013073 A1 | * | 1/2010 | Andry et al. | 257/686 |

OTHER PUBLICATIONS

Office Action received for U.S. Appl. No. 11/728,534, mailed on May 27, 2009, 7 pages.

* cited by examiner

*Primary Examiner* — A O Williams
(74) *Attorney, Agent, or Firm* — Caven & Aghevli LLC

(57) ABSTRACT

Methods and apparatus to provide die backside metallization and/or surface activated bonding for stacked die packages are described. In one embodiment, an active metal layer of a first die may be coupled to an active metal layer of a second die through silicon vias and/or a die backside metallization layer of the second die. Other embodiments are also described.

19 Claims, 4 Drawing Sheets

DIE BACKSIDE METALLIZATION AND SURFACE ACTIVATED BONDING FOR STACKED DIE PACKAGES

BACKGROUND

The present disclosure generally relates to the field of electronics. More particularly, some embodiments of the invention relate to die backside metallization (DBM) and surface activated bonding (SAB) for stacked die packages.

A computer system generally includes various components that may communicate with each other during operation of the computer system. Sometimes these components may be located on different dies. Hence, communication speed of the various dies may be paramount to the performance achieved by a computer system.

In some current computer systems, dies may interlink via relatively long traces, for example, through a computer system motherboard and various substrate levels. Long vertical paths may minimize the extension of current motherboard system architecture, introduce signal propagation delay, or generate additional heat. Some current computer systems aim to reduce the length of interlinks between various dies by stacked die technology and direct silicon via technology for direct die interlink. Utilization of direct silicon via technology for stacked dies may, however, require one die to carry the power source for another die. This approach may generate thermal stress on the die that is responsible for carrying the power source. Also, one of the two dies in a stacked die design may receive minimal input/output (I/O) relative to the remaining die.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Some of the embodiments discussed herein (such as the embodiments discussed with reference to FIGS. 1-5) may utilize SAB and/or DBM in stacked die packages to improve signal routing, thermal behavior, etc. For example, such implementations may provide efficient mechanisms for transferring data and/or power signals to various dies. In an embodiment, a relatively shorter linkage between various dies such as active dies (including for example a central processing unit (CPU) die, chipset(s), network communication interfaces, and/or memory (such as flash memory)) may be provided to improve functionality and/or efficiency. Accordingly, in some embodiments, communication speed between various dies may be improved.

Figure 1:
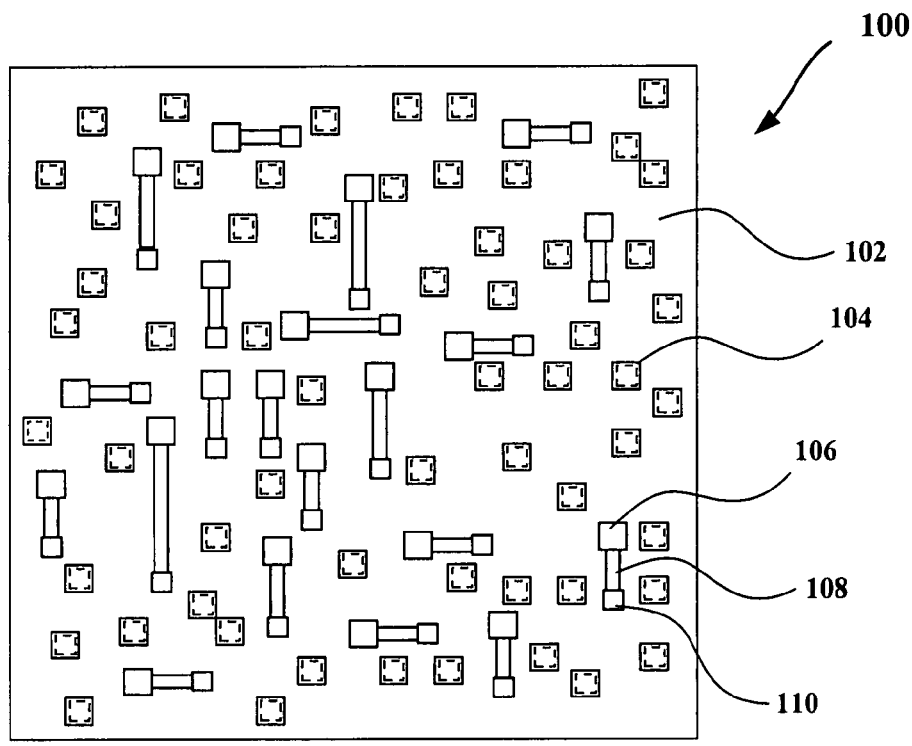
FIG. 1 illustrates a top view of a die backside according to an embodiment of the invention.

More particularly, FIG. 1 illustrates a top view of a die backside 100 according to an embodiment of the invention. The die backside 100 may include a passivation portion 102, one or more DBM surface pads 104 (e.g., for SAB interconnection with another die), one or more surface pads 106 (e.g., which may be DBM surface pads for SAB interconnection with another die), and/or one or more DBM traces 108 (e.g., which may couple surface pads 106 and silicon via openings 110). In one embodiment, the traces 108 may be copper traces. Other types of metals may also be utilized to construct the traces 108, such as aluminum or the like.

Figure 2:
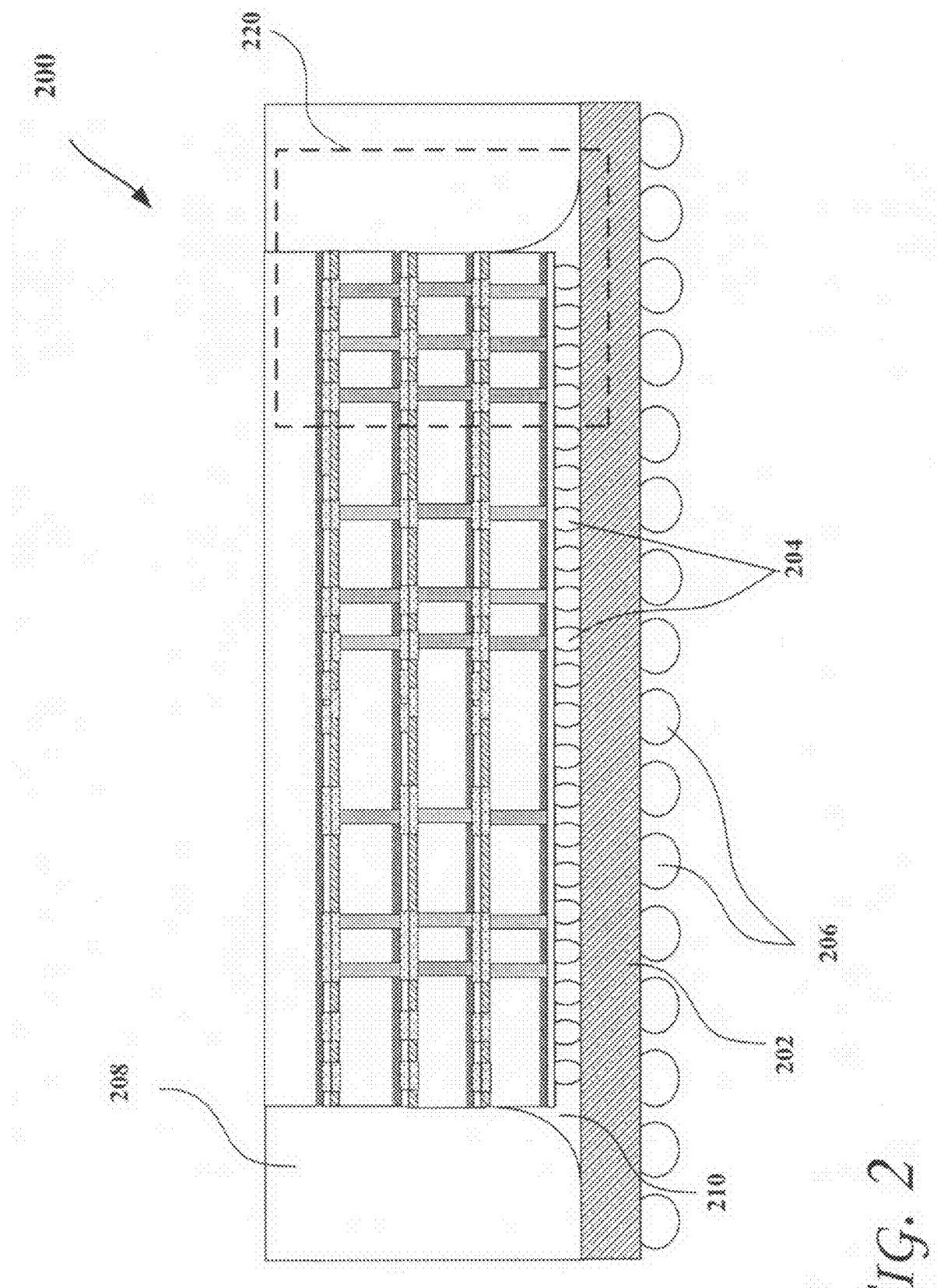
FIG. 2 illustrates a cross sectional side view of a semiconductor device in accordance with an embodiment of the invention.

FIG. 2 illustrates a cross sectional side view of a semiconductor device 200 in accordance with an embodiment of the invention. In an embodiment, the device 200 illustrates die-die interconnection through DBM-active metal layer SAB within a multiple stacked package. As shown in FIG. 2, the device 200 may include one or more dies that are stacked on a package substrate 202. The package substrate 202 may be coupled to the bottom die via solder bumps 204. Solder bumps 206 may also be used to couple the package substrate 202 to another component such as a motherboard (not shown), etc.

Furthermore, in some embodiments, a molding compound 208 may be provided to mechanically and/or thermally couple various components of the device 200. The molding compound 208 may be constructed with material such as epoxy, epoxy with particles (such as silica particles), organic cylinders, plastic mold, plastic mold with particles/fiber, etc. In one embodiment, underfill 210 may be provided between the substrate 202 and the bottom die (which may be constructed with material such as epoxy in an embodiment). Further details regarding an embodiment of a portion of 220 of the device 200 will be further discussed with reference to the FIG. 3.

Figure 3:
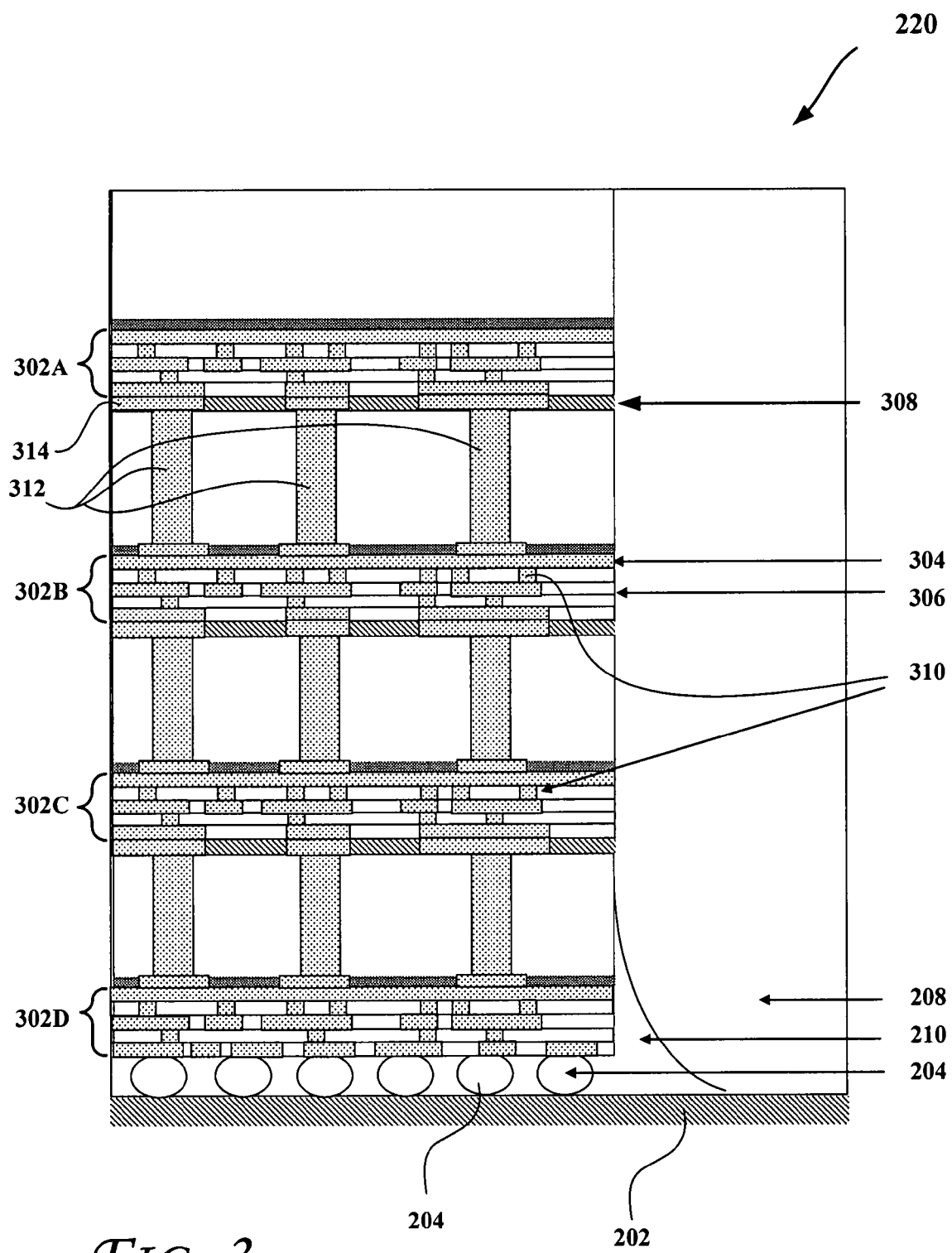
FIG. 3 illustrates a cross sectional side view of the portion of the semiconductor device of FIG. 2, according to an embodiment.

FIG. 3 illustrates a cross sectional side view of the portion 220 of the semiconductor device 200 of FIG. 2, according to an embodiment. The portion 220 shown in FIG. 3 may include one or more dies, where each die may include one or more set of layers (illustrated as layers 302A-302D). As shown in FIG. 3, the layers 302D (corresponding to the bottom die) may be coupled to the substrate 202 via solder bumps 204 (such as discussed with reference to FIG. 2). Also, the underfill 210 and/or molding compound 208 may also be provided such as discussed with reference to FIG. 2.

For the sake of simplicity, various layers corresponding or coupled to the layers 302B will now be discussed with reference to an embodiment. However, other layers (e.g., layers 302A, 302C, and/or 302D) may be the same or similar to the layers 302B in some embodiments. As shown in FIG. 3, the layers 302B may include a die active metal layer 304 and/or one or more dielectric layers 306. The layers 302B may be coupled to a die backside passivation layer 308. Furthermore, metal vias 310 may be provided to couple various metal layers. Silicon vias 312 may also be used to couple active metal layers of one die to the DBM layer of the same die (e.g., active metal layers 302B to the DBM layer 314). In an embodiment, SAB may be used to couple a die active metal layer to the DBM layer of another die (e.g. active metal layer 302A to the DBM layer 314).

As discussed with reference to FIGS. 2 and 3, multiple stacked chip-scale packages may be provided through the use of DBM and SAB interconnections. More particularly, in some embodiments, multiple dies may be coupled through surface activated bonding (SAB). Generally, SAB method may be based on the strong adhesive force generated when two atomically clean surfaces come in contact. The active surface may be obtained by the dry etching processes performed in clean atmosphere, e.g., including high-vacuum condition such as fast atom beam bombardment, ion beam, and/or plasma irradiation. Such approaches may provide for additional I/O and/or power supply via SAB.

Figure 4:
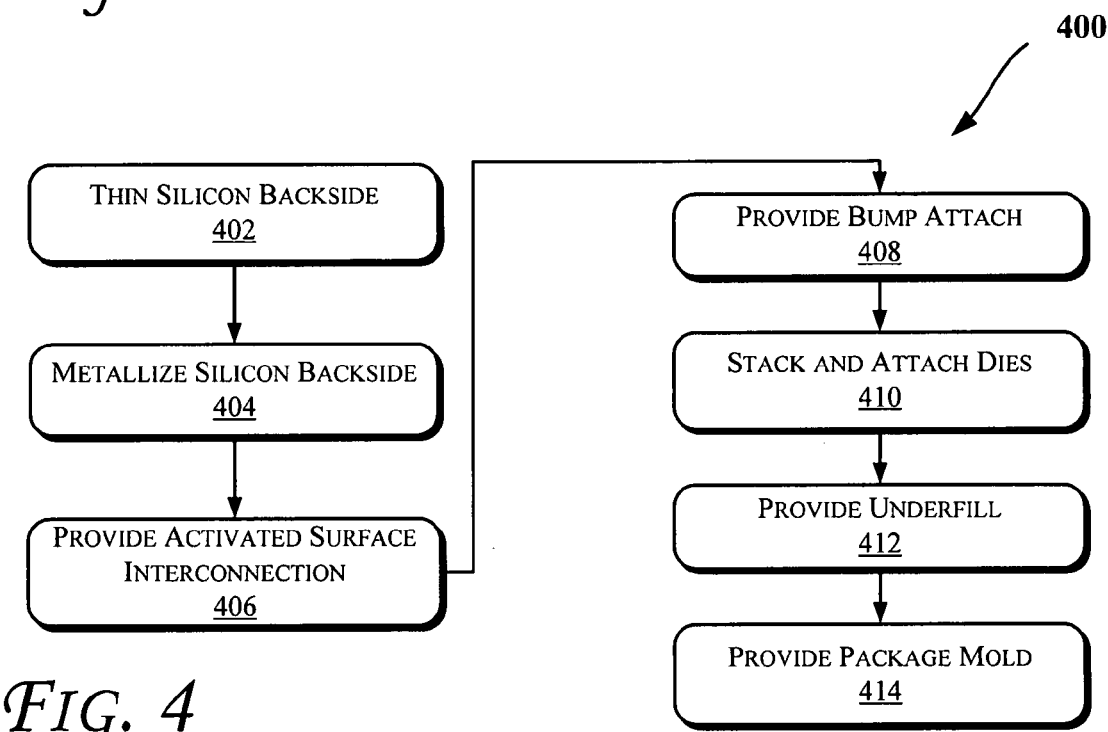
FIG. 4 illustrates a block diagram of a method according to an embodiment.

FIG. 4 illustrates a block diagram of an embodiment of a method 400 to provide a stacked die package. In an embodiment, various components discussed with reference to FIGS. 1-3 and 5 may be utilized to perform one or more of the operations discussed with reference to FIG. 4. For example, the method 400 may be used to provide the device 200 or one or more components of the system 500 of FIG. 5.

Referring to FIGS. 1-4, at an operation 402, backside of silicon may be thinned (e.g., backside of dies of FIGS. 2-3 may be thinned, for example, to improve heat dissipation and/or reduce package total thickness). At an operation 404, the silicon backsides may be metallized (e.g., to introduce the DBM layers 314). In some embodiments, at operation 404, dies containing metal layers 302B-302D may be put through one or more of: a post-silicon backside thinning process, Nitride layer coating process, passivation layer coating process, application of one or more photo resist layers (e.g., and removal of the passivation layer (e.g., via etching) in between application of the photo resist layers), removal of the Nitride layer (e.g., via etching), removal of the one or more photo resist layers, Copper layer surface coating process, and/or silicon backside grinding process.

At an operation 406, activated surface interconnection between dies may be provided. At an operation 408, bump attach may be provided, e.g., solder bumps may be provided (such as the bumps 204 and/or 206). At an operation 410, die and substrate may be attached, e.g., via the bumps of operation 408 to couple dies or other component of semiconductor device. Any electrical interconnection including but not limited to surface activated bonding (SAB) and/or solder bump interconnection may be used to couple dies or other components of a semiconductor device. At an operation 412, an underfill may be provided (e.g., such as the underfill 210). At an operation 414, a package mold (such as the molding compound 208) may be provided. The order of operations 406-414 may be interchangeable in some embodiments.

In some embodiments, one or more of die backside metallization (DBM), surface activated bonding (SAB), and/or through silicon vias (such as vias 312 of FIGS. 2-3) may provide relatively direct (e.g., shorter) die to die or die to substrate communication (such as discussed with reference to FIGS. 1-4). Such embodiments may improve communication speed and/or efficiency between components of a computing system (such as the components discussed with reference to FIG. 5). Additionally, the minimized vertical path in package and/or socket provided through the techniques discussed with reference to FIGS. 1-4 may allow for the extension of motherboard system architecture.

Moreover, some embodiments may: (a) allow for an increase in signal transmission frequency between integrated circuit (IC) chips and the package systems; (b) enable high density and fine pitch between chips even at sub-micron levels; (c) provide relatively minimal thermal mismatch between chips to reduce stacked die shear stress (which may also allow the interconnection height to be at the range of sub-micron level); (d) a staggered stacked die system between active logic (e.g., CPU or server with chipset and flash or network communication products) may reduce the interconnection delays between package and board; reduce substrate stress towards the active die metal layers; (e) ultra-low interconnect pitch would allow the metal layer to be build at a minimum (e.g., two to three layers) (which may reduce the fabrication process costs); and/or (f) enable the process to be performed between two solid contacts at room temperature (which may reduce thermal stress during bonding process). Additionally, some embodiments may allow for a reduction in the number of active metal layers to 2 or 3 metal layers for each die versus conventional 7 to 9 metal layers. Moreover, SAB interconnect may provide for a relatively low coefficient of thermal expansion (CTE) mismatch between die to die interconnect with ultra low pitch capability.

Figure 5:
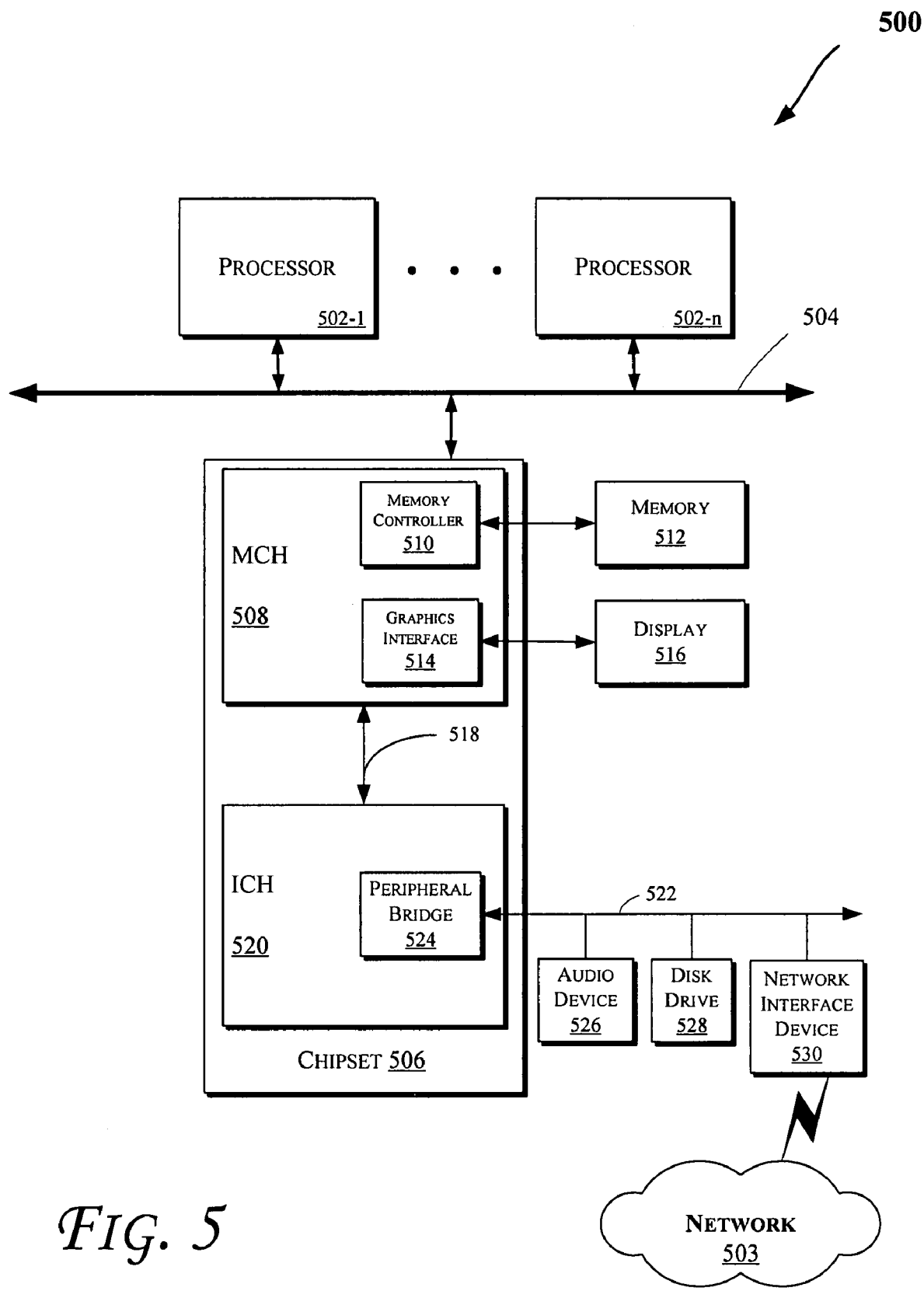
FIG. 5 illustrates a block diagram of a computing system, which may be utilized to implement various embodiments discussed herein.

FIG. 5 illustrates a block diagram of a computing system 500 in accordance with an embodiment of the invention. The computing system 500 may include one or more central processing unit(s) (CPUs) 502 or processors that communicate via an interconnection network (or bus) 504. The processors 502 may include a general purpose processor, a network processor (that processes data communicated over a computer network 503), or other types of a processor (including a reduced instruction set computer (RISC) processor or a complex instruction set computer (CISC)). Moreover, the processors 502 may have a single or multiple core design. The processors 502 with a multiple core design may integrate different types of processor cores on the same integrated circuit (IC) die. Also, the processors 502 with a multiple core design may be implemented as symmetrical or asymmetrical multiprocessors. Moreover, the operations discussed with reference to FIGS. 1-4 may be performed by one or more components of the system 500.

A chipset 506 may also communicate with the interconnection network 504. The chipset 506 may include a memory control hub (MCH) 508. The MCH 508 may include a memory controller 510 that communicates with a memory 512. The memory 512 may store data, including sequences of instructions that are executed by the CPU 502, or any other device included in the computing system 500. In one embodiment of the invention, the memory 512 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 504, such as multiple CPUs and/or multiple system memories.

The MCH 508 may also include a graphics interface 514 that communicates with a display 516. In one embodiment of the invention, the graphics interface 514 may communicate with the display 516 via an accelerated graphics port (AGP). In an embodiment of the invention, the display 516 may be a flat panel display that communicates with the graphics interface 514 through, for example, a signal converter that translates a digital representation of an image stored in a storage device such as video memory or system memory into display signals that are interpreted and displayed by the display 516. The display signals produced by the interface 514 may pass through various control devices before being interpreted by and subsequently displayed on the display 516.

A hub interface 518 may allow the MCH 508 and an input/output control hub (ICH) 520 to communicate. The ICH 520 may provide an interface to I/O devices that communicate with the computing system 500. The ICH 520 may communicate with a bus 522 through a peripheral bridge (or controller) 524, such as a peripheral component interconnect (PCI) bridge, a universal serial bus (USB) controller, or other types of peripheral bridges or controllers. The bridge 524 may provide a data path between the CPU 502 and peripheral devices. Other types of topologies may be utilized. Also, multiple buses may communicate with the ICH 520, e.g., through multiple bridges or controllers. Moreover, other peripherals in communication with the ICH 520 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 522 may communicate with an audio device 526, one or more disk drive(s) 528, and a network interface device 530 (which is in communication with the computer network 503). Other devices may communicate via the bus 522. Also, various components (such as the network interface device 530) may communicate with the MCH 508 in some embodiments of the invention. In addition, the processor 502 and the MCH 508 may be combined to form a single chip. Furthermore, the graphics accelerator 516 may be included within the MCH 508 in other embodiments of the invention.

Furthermore, the computing system 500 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 528), a floppy disk, a compact disk ROM (CD-ROM), a digital versatile disk (DVD), flash memory, a magneto-optical disk, or other types of nonvolatile machine-readable media that are capable of storing electronic data (e.g., including instructions). In an embodiment, components of the system 500 may be arranged in a point-to-point (PtP) configuration. For example, processors, memory, and/or input/output devices may be interconnected by a number of point-to-point interfaces.

In various embodiments of the invention, the operations discussed herein, e.g., with reference to FIGS. 1-5, may be implemented as hardware (e.g., logic circuitry), software, firmware, or combinations thereof, which may be provided as a computer program product, e.g., including a machine-readable or computer-readable medium having stored thereon instructions (or software procedures) used to program a computer to perform a process discussed herein. The machine-readable medium may include a storage device such as those discussed with respect to FIG. 5.

Additionally, such computer-readable media may be downloaded as a computer program product, wherein the program may be transferred from a remote computer (e.g., a server) to a requesting computer (e.g., a client) by way of data signals embodied in a carrier wave or other propagation medium via a communication link (e.g., a bus, a modem, or a network connection). Accordingly, herein, a carrier wave shall be regarded as comprising a machine-readable medium.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. An apparatus comprising:
a first die having an active metal layer;
a second die having a die backside metallization layer that is electrically coupled to the active metal layer of the first die; and
at least one silicon via, coupled between an active metal layer of the second die to the die backside metallization layer of the second die, to electrically couple the active metal layer of the first die to the active metal layer of the second die through the die backside metallization layer, wherein a molding compound is to couple the first die and the second die, the molding compound to encapsulate the first and second dies and wherein the molding compound is to comprise one or more of: organic cylinders, plastic mold, or plastic mold with particles or fiber.

2. The apparatus of claim 1, wherein the first die and the second die are coupled through a surface activated bonding layer.

3. The apparatus of claim 1, further comprising a substrate that is coupled to an active metal layer of the second die.

4. The apparatus of claim 1, wherein the die backside metallization layer of the second die comprises one or more surface pads.

5. The apparatus of claim 4, further comprising one or more traces to at least couple some of the surface pads and corresponding openings across a surface of the second die.

6. The apparatus of claim 1, wherein the molding compound is to couple the first die, the second die, and a package substrate.

7. The apparatus of claim 1, wherein at least one of the first die or the second die comprises one or more of: a processor, a memory device, a network communication device, or a chipset.

8. The apparatus of claim 7, wherein the processor comprises one or more processor cores.

9. A method comprising:
metallizing a backside of a first die;
stacking a second die on the first die;
coupling an active metal layer of the second die and the metallized backside of the first die;
providing a molding compound to couple the first die and the second die, wherein the molding compound is to encapsulate the first and second dies, wherein the molding compound is to comprise one or more of: organic cylinders, plastic mold, or plastic mold with particles or fiber; and
coupling the metallized backside of the first die to one or more through silicon vias, wherein the one or more through silicon vias are to be coupled between a first portion of the first die and a second portion of the first die.

10. The method of claim 9, further comprising coupling the first or second die to a package substrate.

11. The method of claim 9, further comprising stacking a plurality of dies on the first die.

12. The method of claim 9, wherein the first portion of the first die is to comprise an active metal layer.

13. The method of claim 9, wherein the second portion of the first die is to comprise a die backside metallization layer of the first die.

14. A stacked integrated circuit package comprising:
   a first die having an active metal layer;
   a second die having a die backside metallization layer that is electrically coupled to the active metal layer of the first die; and
   at least one silicon via, coupled between a first portion and a second portion of the second die, to electrically couple the active metal layer of the first die to the active metal layer of the second die through the die backside metallization layer; and
   a molding compound to couple the first die and the second die, the molding compound to encapsulate the first and second dies, wherein the molding compound is to comprise one or more of: organic cylinders, plastic mold, or plastic mold with particles or fiber.

15. The package of claim 14, wherein the first portion is to comprise an active metal layer of the second die.

16. The package of claim 14, wherein the second portion is to comprise a backside metallization layer of the second die.

17. The package of claim 14, wherein the first die and the second die are coupled through a surface activated bonding layer.

18. The package of claim 14, further comprising a substrate that is coupled to an active metal layer of the second die.

19. The package of claim 14, wherein at least one of the first die or the second die is to comprise one or more of: a processor, a memory device, a network communication device, or a chipset.

* * * * *